United States Patent [19]
Hoshi et al.

[11] Patent Number: 5,882,838
[45] Date of Patent: Mar. 16, 1999

[54] SILVER HALIDE LIGHT-SENSITIVE MATERIAL COMPRISING SUPPORT, HARDENING LAYER AND LIGHT-SENSITIVE LAYER

[75] Inventors: Satoshi Hoshi; Hiroyuki Nagase, both of Shizuoka, Japan

[73] Assignee: Fuji Photo Film Co., Ltd., Kanagawa, Japan

[21] Appl. No.: 943,122

[22] Filed: Oct. 3, 1997

[30] Foreign Application Priority Data

Oct. 3, 1996 [JP] Japan ................................. 8-283354

[51] Int. Cl.$^6$ .............................. G03C 1/46; G03C 1/93; G03C 8/08; G03C 8/40
[52] U.S. Cl. ......................... 430/203; 430/202; 430/205; 430/271.1; 430/330; 430/531; 430/627; 430/628; 430/639; 430/641
[58] Field of Search .................................. 430/202, 203, 430/205, 271.1, 330, 627, 628, 531, 639, 641

[56] References Cited

U.S. PATENT DOCUMENTS

| | | | |
|---|---|---|---|
| 5,122,443 | 6/1992 | Takeda | 430/203 |
| 5,290,659 | 3/1994 | Takeda | 430/203 |
| 5,554,482 | 9/1996 | Yokoya et al. | 430/203 |

*Primary Examiner*—Richard L. Schilling
*Attorney, Agent, or Firm*—Sughrue, Mion, Zinn, Macpeak & Seas, PLLC

[57] ABSTRACT

A silver halide light-sensitive material comprises a support, a hardening layer and a light-sensitive layer. The hardening layer contains an ethylenically unsaturated polymerizable compound or an ethylenically unsaturated cross-linkable polymer. The light-sensitive layer contains silver halide and a hydrophilic polymer. The hardening layer or the light-sensitive layer contains a reducing agent. An adhesive layer or the light-sensitive layer contains a water-soluble synthetic polymer. The adhesive layer is provided between the hardening layer and the light-sensitive layer. The water-soluble synthetic polymer comprises a repeating unit represented by the formula (I) in an amount of at least 50 mol %:

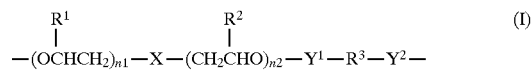

in which each of n1 and n2 is an integer of 10 to 5,000; each of $R^1$ and $R^2$ is hydrogen, an alkyl group or an aryl group; X is —O—$R^4$—O— or —$NR^5$—; $R^4$ is an alkylene group, an alkyleneoxyalkylene group, an arylene group or an aralkylene group; $R^5$ is an alkyl group or an aryl group; $Y^1$ is —CO— or —CONH—; $Y^2$ is —CO— or —NHCO—; and $R^3$ is an alkylene group, an alkenylene group, an arylene group or an aralkylene group.

14 Claims, 2 Drawing Sheets

FIG. 1

FIG. 2

SILVER HALIDE LIGHT-SENSITIVE MATERIAL COMPRISING SUPPORT, HARDENING LAYER AND LIGHT-SENSITIVE LAYER

FIELD OF THE INVENTION

The present invention relates to a silver halide light-sensitive material comprising a support, a hardening layer and a light-sensitive layer.

BACKGROUND OF THE INVENTION

U.S. Pat. No. 4,629,676 (Hayakawa et al.) and European Patent No. 0174634 (Fuji Photo Film Co., Ltd.) disclose an image forming method comprising the steps of imagewise exposing to light a light-sensitive material and heating the light-sensitive material. The light-sensitive material comprises a support and a light-sensitive hardening layer containing silver halide, a reducing agent and a polymerizable compound. The silver halide is developed by heating the light-sensitive material to form a polymer image. The polymerization is initiated by an oxidation radical of the reducing agent (including a radical formed from an oxidation product of the reducing agent).

U.S. Pat. No. 5,122,443 (Takeda), 5,290,659 (Takeda) and European Patent No. 0426192 (Fuji Photo Film Co., Ltd.) disclose embodiments of the light-sensitive materials, which are advantageously used for the preparation of a lithographic plate. In the light-sensitive materials for the lithographic plate, the light-sensitive hardening layer preferably comprises a hardening layer and a light-sensitive layer. The hardening layer contains a polymerizable compound and a hydrophobic polymer. The light-sensitive layer contains silver halide and a hydrophilic polymer. The hardening layer or the light-sensitive layer further contains a reducing agent. The light-sensitive material an further comprise an image formation accelerating layer containing a base or base precursor provided on the light-sensitive layer.

A process for the preparation of a lithographic plate comprises the steps of imagewise exposing to light the light-sensitive material, heating the material, removing the light-sensitive layer from the material and removing the unhardened area of the hardening layer with an alkaline etching solution. The formed replica image is used as a printing plate.

The hardening layer containing a polymerizable compound and a hydrophobic polymer is hydrophobic, while the light-sensitive layer containing silver halide and a hydrophilic polymer is hydrophilic. Accordingly, the adhesion between the two layers is weak. The light-sensitive material was sometimes destroyed by separation between the layers while handling the light-sensitive material. The separation was caused when a pressure is applied to the light-sensitive material, for example when the material was cut, the surface of the material was rubbed, the material was rolled or stacked, or the material was taken out from a roll or a stack.

Japanese Patent Provisional Publication Nos. 8(1996)-123035, 8(1996)-146600, 8(1996)-184968 and 8(1996)-194314 disclose silver halide light-sensitive materials improved in the adhesion between the hardening layer and the light-sensitive layer.

Japanese Patent Provisional Publication No. 8(1996)-123035 discloses a light-sensitive material containing a hydrophobic polymer having an acidic group in the form of a salt as a binder of a hardening layer. Japanese Patent Provisional Publication No. 8(1996)-146600 discloses a process for the preparation of a light-sensitive material in which a coating solution for a hardening layer contains a hydrophobic polymer in a mixture of a good solvent and a poor solvent. The boiling point of the poor solvent is higher than that of the good solvent, and the difference between the boiling points is not less than 3° C. Japanese Patent Provisional Publication No. 8(1996)-184968 discloses a light-sensitive material comprising a hardening layer containing a hydrophilic polymer having an acidic group and a light-sensitive layer containing a hydrophilic polymer and an aminoalcohol. Japanese Patent Provisional Publication No. 8(1996)-194314 discloses a light-sensitive material comprising an adhesive layer provided between a hardening layer and a light-sensitive layer. The adhesive layer contains a polymer or an additive proposed in the above-mentioned publications.

The above-mentioned publications propose modifying a polymer that has been used as a binder of a hardening layer or a light-sensitive layer to enhance the adhesion between the layers. It has been proved that the binder of the hardening layer or the light-sensitive layer has no adverse effects on the light-sensitive material or the image forming system.

SUMMARY OF THE INVENTION

The present inventors have studied the methods of improving the binder of the hardening layer or the light-sensitive layer described in the above-mentioned publications. As a result, the inventors note that each of the methods has some problems.

The hydrophobic polymer having an acidic group in the form of a salt disclosed in Japanese Patent Provisional Publication No. 8(1996)-123035 releases a counter ion of the salt at a high temperature and a high humidity to make condition basic in the light-sensitive material. The sensitivity and stability of the light-sensitive material are degraded under the basic condition. The mixture of a good solvent and a poor solvent disclosed in Japanese Patent Provisional Publication No. 8(1996)-146600 causes a phase separation in a hardening layer. It is difficult to disperse components uniformly in the hardening layer in which the phase separation is caused. The aminoalcohol disclosed in Japanese Patent Provisional Publication No. 8(1996)-184968 is a basic compound, which degrades the stability of the light-sensitive material. Similar problems were observed in a light-sensitive material having an adhesive layer described in Japanese Patent Provisional Publication No. 8(1996)-194314.

Now, the present inventors have researched a new binder to enhance the adhesion between the hardening layer and the light-sensitive layer in place of modifying the previous binder of the hardening layer or the light-sensitive layer. Numerous polymers such as commercially available adhesives have been proposed to enhance adhesion.

However, the silver halide light-sensitive material has a complicated structure to form a hardened image by using silver halide as a photosensor. The image forming system also comprises complex reactions. According to study of the inventors, most of the known binders or adhesives cannot be used in the silver halide light-sensitive material because the binders or adhesives cause serious problems in the light-sensitive material or the image forming system. For example, the adhesion is insufficient, it is difficult to prepare a light-sensitive material, the stability of the material is degraded, or an image forming reaction is inhibited.

An object of the invention is to provide a silver light-sensitive material improved in adhesion between a hardening layer and a light-sensitive layer without causing adverse effects on the light-sensitive material or the image forming system.

The present invention provides a silver halide light-sensitive material comprising a support, a hardening layer and a light-sensitive layer, said hardening layer containing an ethylenically unsaturated polymerizable compound or an ethylenically unsaturated cross-linkable polymer, said light-sensitive layer containing silver halide and a hydrophilic polymer, and said hardening layer or said light-sensitive layer containing a reducing agent, wherein an adhesive layer containing a water-soluble synthetic polymer is provided between the hardening layer and the light-sensitive layer, said water-soluble synthetic polymer comprising a repeating unit represented by the formula (I) in an amount of at least 50 mol %:

in which each of n1 and n2 independently is an integer of 10 to 5,000; each of $R^1$ and $R^2$ independently is hydrogen, an alkyl group having 1 to 10 carbon atoms or an aryl group having 6 to 10 carbon atoms, and the groups represented by $R^1$ or $R^2$ may be different from each other; X is —O—$R^4$—O— or —$NR^5$—; $R^4$ is an alkylene group having 2 to 20 carbon atoms, an alkyleneoxyalkylene group having 4 to 20 carbon atoms, an arylene group having 6 to 20 carbon atoms or an aralkylene group having 7 to 20 carbon atoms; $R^5$ is an alkyl group having 1 to 20 carbon atoms or an aryl group having 6 to 20 carbon atoms; $Y^1$ is —CO— or —CONH—; $Y^2$ is —CO— or —NHCO—; and $R^3$ is an alkylene group having 1 to 20 carbon atoms, an alkenylene group having 2 to 20 carbon atoms, an arylene group having 6 to 20 carbon atoms or an aralkylene group having 7 to 20 carbon atoms.

The invention also provides a silver halide light-sensitive material comprising a support, a hardening layer and a light-sensitive layer, said hardening layer containing an ethylenically unsaturated polymerizable compound or an ethylenically unsaturated cross-linkable polymer, said light-sensitive layer containing silver halide and a hydrophilic polymer, and said hardening layer or said light-sensitive layer containing a reducing agent, wherein the light-sensitive layer further contains a water-soluble synthetic polymer comprising a repeating unit represented by the formula (I) in an amount of at least 50 mol %.

The present invention is characterized in that the above-mentioned water-soluble synthetic polymer (polyester or polyurethane) is used to enhance adhesion between a hardening layer and a light-sensitive layer. The water-soluble synthetic polymer is added to an adhesive layer or the light-sensitive layer. The adhesive layer is provided between the hardening layer and the light-sensitive layer.

The adhesive layer is well adhered to the light-sensitive (hydrophilic layer) because the polymer of the adhesive layer is water-soluble. Further, the water-soluble synthetic polymer has good adhesion because the polymer has a low glass transition temperature. The interface between the hardening layer and the adhesive layer or the light-sensitive layer is wetted with the water-soluble synthetic polymer because the polymer is fluid at the room temperature. The wetted interface increases the number of the sites of contact at which a molecular interaction is caused between the layers.

Since the adhesion between the hardening layer and the light-sensitive layer is improved as is mentioned above, the light-sensitive material of the present invention is scarcely destroyed by separation between the layers while handling the light-sensitive material.

Further, the water-soluble synthetic polymer used in the present invention has no adverse effects on the light-sensitive material and the image forming system.

DETAILED DESCRIPTION OF THE INVENTION

[Water-soluble synthetic polymer]

The water-soluble synthetic polymer comprises a repeating unit represented by the formula (I) in an amount of at least 50 mol %.

In the formula (I), each of n1 and n2 independently is an integer of 10 to 5,000, preferably 20 to 3,000, more preferably 30 to 2,000, further preferably 40 to 1,000, and most preferably 50 to 500.

In the formula (I), each of $R^1$ and $R^2$ independently is hydrogen, an alkyl group having 1 to 10 carbon atoms or an aryl group having 6 to 10 carbon atoms. Hydrogen and an alkyl group are preferred. The alkyl group preferably has 1 to 6 carbon atoms, more preferably has 1 to 4 carbon atoms, further preferably has 1 or 2 carbon atoms, and most preferably has one carbon atom (most preferably is methyl). The formula (I) contains 10 or more (the number of n1 or n2) groups represented by $R^1$ or $R^2$. The groups may be different from each other.

In the formula (I), X is —O—$R^4$—O— or —$NR^5$—.

$R^4$ is an alkylene group having 2 to 20 carbon atoms, an alkyleneoxyalkylene group having 4 to 20 carbon atoms, an arylene group having 6 to 20 carbon atoms or an aralkylene group having 7 to 20 carbon atoms. The alkylene group and the alkyleneoxyalkylene group are preferred, and the alkylene group is more preferred. The alkyleneoxyalkylene group means a divalent group formed by combining two alkylene groups with an ether bond of oxygen atom. The alkylene group preferably has 2 to 10 carbon atoms, more preferably has 2 to 6 carbon atoms, further preferably has 2 to 4 carbon atoms, and most preferably has 2 or 3 carbon atoms (most preferably is ethylene or propylene).

$R^5$ is an alkyl group having 1 to 20 carbon atoms or an aryl group having 6 to 20 carbon atoms. The alkyl group may have a chain structure or a cyclic structure. The chain structure can be branched. The alkyl group preferably has 1 to 12 carbon atoms. The aryl group preferably has 6 to 10 carbon atoms.

In the formula (I), $Y^1$ is —CO— or —CONH—, and $Y^2$ is —CO— or —NHCO—. In the case that $Y^1$ is —CO—, $Y^2$ preferably is —CO—. In the case that $Y^1$ is —CONH—, $Y^2$ preferably is —NHCO—.

In the formula (I), $R^3$ is an alkylene group having 1 to 20 carbon atoms, an alkenylene group having 2 to 20 carbon atoms, an arylene group having 6 to 20 carbon atoms or an aralkylene group having 7 to 20 carbon atoms. The alkylene group, the arylene group and the aralkylene group are preferred. The aralkylene group means a combination of an alkylene group and an arylene group.

A particularly preferred repeating unit is represented by the formula (Ia).

In the formula (Ia), each of m1 and m2 independently is an integer of 20 to 3,000.

In the formula (Ia), each of $R^{11}$ and $R^{12}$ independently is hydrogen, methyl, ethyl or phenyl. Hydrogen, methyl and ethyl are preferred, and hydrogen and methyl are more preferred. The formula (Ia) contains 20 or more (the number of m1 or m2) groups represented by $R^{11}$ or $R^{12}$. The groups may be different from each other. At least 70 mol % of the groups represented by $R^{11}$ or $R^{12}$ most preferably are hydrogen.

In the formula (Ia), $X^{10}$ is —O—$R^{14}$—O— or —$NR^{15}$—.

$R^{14}$ is ethylene or propylene.

$R^{15}$ is an alkyl group having 1 to 10 carbon atoms or an aryl group having 6 to 10 carbon atoms.

In the formula (Ia), $Y^{11}$ is —CO— or —CONH— and $Y^{12}$ is —CO— or —NHCO—.

In the formula (Ia), $R^{13}$ is an alkylene group having 1 to 20 carbon atoms, an arylene group having 6 to 20 carbon atoms or an aralkylene group having 7 to 20 carbon atoms.

Examples of the repeating units represented by the formula (I) are shown below.

In the formulas, n is an integer of 50 to 500, and R is hydrogen or methyl, which means that each of 50 or more groups represented by R independently is hydrogen or methyl.

The water-soluble synthetic polymer can be a homopolymer consisting of a repeating unit represented by the formula (I). Further, the characteristics (e.g., water solubility) can be adjusted by introducing another repeating unit into the polymer.

In the case that the water-soluble synthetic polymer is a copolymer, the copolymer comprises a repeating unit represented by the formula (I) in an amount of at least 50 mol %, preferably at least 70 mol %, more preferably at least 80 mol %, further preferably at least 90 mol %, and most preferably at least 95 mol %.

Japanese Patent Provisional Publication No. 7(1995)-47645 describes that the repeating unit represented by the formula (1) is a component of a film to be laminated with a polyvinyl alcohol resin film.

The polymer can be synthesized by the following reactions

As is shown in the reaction 2a, a polyester is synthesized by a reaction of the diol with the dicarboxylic acid. The reaction is conducted preferably under a reduced pressure (0.001 to 20 mmHg) at 80° to 250° C. for 30 minutes to 10 hours. The amount of the dicarboxylic acid is preferably in the range of 1 to 5 weight parts based on 100 weight parts of the diol.

(Reaction 1)

In the reaction 1, each of n1, n2, $R^1$, $R^2$ and X has the same meanings as in the formula (I).

As is shown in the reaction 1, the compound corresponding to H-X-H is the starting material. A ring-opening addition polymerization is subjected to the starting material and the epoxy compounds to form the diol shown in the formula 1. An alkali (e.g., sodium hydroxide) is preferably used as a reaction catalyst. The reaction is conducted preferably at 90° to 200° C. for 20 to 30 hours.

The obtained diol is reacted with a dicarboxylic acid or a diisocyanate to synthesize a polyester or a polyurethane.

(Reaction 2a)

In the reaction 2a, n1, n2, $R^1$, $R^2$, $R^3$ and X have the same meanings as in the formula (I), and p means the polymerization degree of the synthesized polymer.

(Reaction 2b)

In the reaction 2b, n1, n2, $R^1$, $R^2$, $R^3$ and X have the same meanings as in the formula (I), and q means the polymerization degree of the synthesized polymer.

As is shown in the reaction 2b, a polyurethane is synthesized by a reaction of the diol with the diisocyanate. The reaction is conducted preferably at 80° to 150° C. for 1 to 5 hours. The amount of the diisocyanate is preferably in the range of 0.5 to 2 weight parts based on 100 weight parts of the diol.

In the case that a copolymer is synthesized, not only the diol obtained by the reaction 1 but also another polyol (preferably another diol) or a polyamine (preferably a diamine) is reacted with the dicarboxylic acid or the diisocyanate. An amido bond is obtained by a reaction of a polyamine and a dicarboxylic acid. A urea bond is obtained by a reaction of polyamine and a diisocyanate.

The water-soluble synthetic polymer preferably has a weight average molecular weight preferably in the range of 50,000 to 300,000, and more preferably in the range of 100,000 to 200,000.

In the case that the water-soluble synthetic polymer is added to an adhesive layer, the amount of the polymer is preferably so adjusted that the coating amount of the adhesive layer is in the range of 0.01 to 2 g per $m^2$. The coating amount of the adhesive layer is more preferably in the range of 0.02 to 1.5 g per $m^2$, and most preferably in the range of 0.025 to 1.0 g per $m^2$.

In the case that the water-soluble synthetic polymer is added to a light-sensitive layer, the amount of the polymer preferably in the range of 1 to 80 wt.% based on the coating amount of the light-sensitive layer. The amount of the polymer is more preferably in the range of 3 to 60 wt.%, and most preferably in the range of 5 to 50 wt.%.

[Water-soluble polysaccharide]

A water-soluble polysaccharide is a polymer formed from monosaccharide with glycosidic linkage. There are many natural water-soluble polysaccharides, which are classified under the monosaccharide and the glycosidic linkage. Examples of the industrially available natural water-soluble polysaccharides include cellulose, starch, pullulan, xanthane gum and dextran.

The natural polysaccharides can be denatured or chemically modified. Cellulose and dextran can easily be chemically modified to adjust hydrophilic-hydrophobic characteristic. The present invention preferably uses a cellulose derivative, namely a chemically modified cellulose. Cellulose ester or cellulose ether is preferred, and cellulose ether is particularly preferred.

The water-soluble synthetic polymer has many hydrophilic (hydroxyl) groups. The water-soluble polysaccharide has a function of completely removing a layer containing the water-soluble synthetic polymer (an adhesive layer or a light-sensitive layer) from a light-sensitive material.

Cellulose ether is a polymer formed by substituting all or a part of hydrogen atoms of three hydroxyl groups of monosaccharide units (glucoses with β1–4 linkages) of cellulose with alkyl groups (including substituted alkyl groups).

Examples of cellulose ethers include methyl cellulose, ethyl cellulose, carboxymethyl cellulose, hydroxyethyl cellulose, hydroxypropyl cellulose, diethylaminoethyl cellulose and 1,3-dihydroxypropyl cellulose. Carboxyl can be in the form of a salt, such as an alkali metal (e.g., sodium) salt. The invention can use a mixed ether of cellulose, which is formed by substituting cellulose with two or more alkyl groups. Examples of mixed esters of cellulose include carboxymethyl hydroxyethyl cellulose (carboxyl can be in the form of a salt), hydroxyethyl methyl cellulose, hydroxypropyl methyl cellulose, hydroxybutyl methyl cellulose, ethyl hydroxyethyl cellulose and 2-hydroxyethyl 1-hydroxyethyl cellulose.

The water-soluble polysaccharide is added to a layer containing the water-soluble synthetic polymer (an adhesive layer or a light-sensitive layer). The water-soluble polysaccharide is particularly effective (the effect of dissolving a layer in a solution) in the case that the water-soluble synthetic polymer added to an adhesive layer.

The amount of the water-soluble polysaccharide is preferably in the range of 5 to 150 wt.%, more preferably in the range of 10 to 120 wt.%, further preferably in the range of 15 to 100 wt.%, and most preferably in the range of 20 to 80 wt.%, based on the amount of the water-soluble synthetic polymer.

[Layered structure]

The silver halide light-sensitive material preferably comprises a support, a hardening layer and a light-sensitive layer in the order. However, the light-sensitive material can comprise a support, a light-sensitive layer and a hardening layer in the order in the case that the material is used for the preparation of a color proof. An adhesive layer is provided between the hardening layer and the light-sensitive layer in the above-mentioned two orders. The light-sensitive material can comprise four or more layers such as a hardening layer, an adhesive layer, a light-sensitive layer and an overcoating layer (an image formation accelerating layer). A reducing agent is added to the hardening layer or the light-sensitive layer.

The components of the above-mentioned layers are preferably uniformly dispersed in the layers without use of microcapsules.

The light-sensitive material may further have other optional layers such as a strippable layer, an undercoating layer and an intermediate layer.

Preferred layered structures are described below referring to the drawings.

Figure 1:
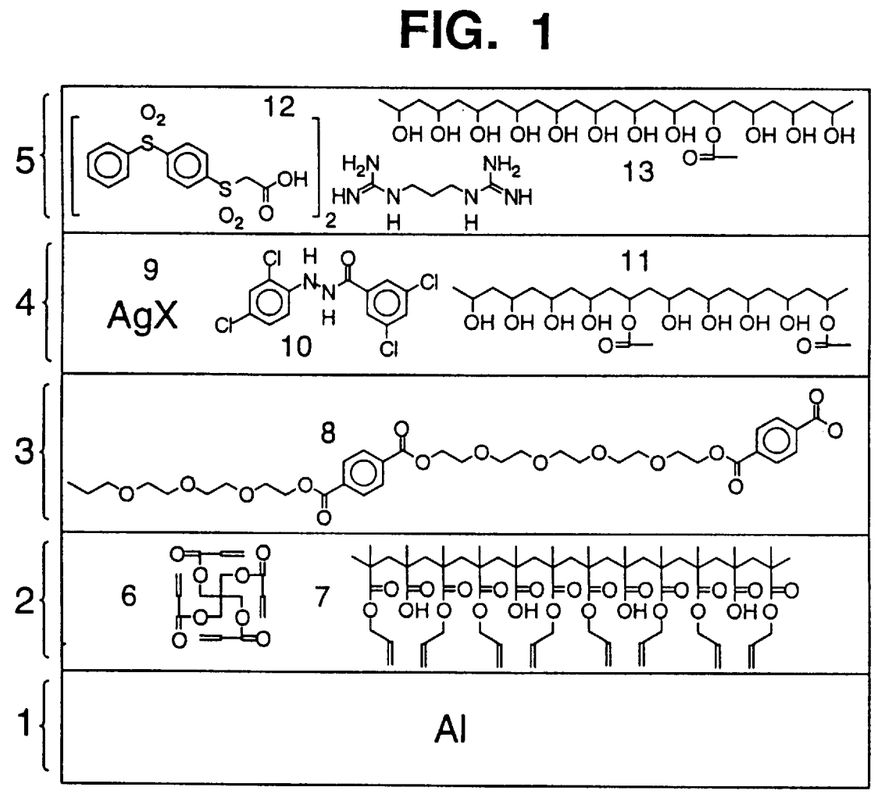
FIG. 1 is a sectional view schematically illustrating a preferred embodiment of a silver halide light-sensitive material.

FIG. 1 is a sectional view schematically illustrating a preferred embodiment of a silver halide light-sensitive material.

The light-sensitive material shown in FIG. 1 comprises an aluminum support (1), a hardening layer (2), an adhesive layer (3), a light-sensitive layer (4) and an image formation accelerating layer (5) in that order. The hardening layer (2) contains an ethylenically unsaturated polymerizable compound (6) and an ethylenically unsaturated crosslinkable linkable polymer having an acidic group (7). The adhesive layer (3) contains a water-soluble synthetic polymer. The adhesive layer (3) has a function of enhancing the adhesion between the hardening layer (2) and the light-sensitive layer (4). The light-sensitive layer (4) contains silver halide (9), a reducing agent (10) and a hydrophilic polymer (11). The image formation accelerating layer (5) contains a base precursor (12) and a hydrophilic polymer (13).

Figure 2:
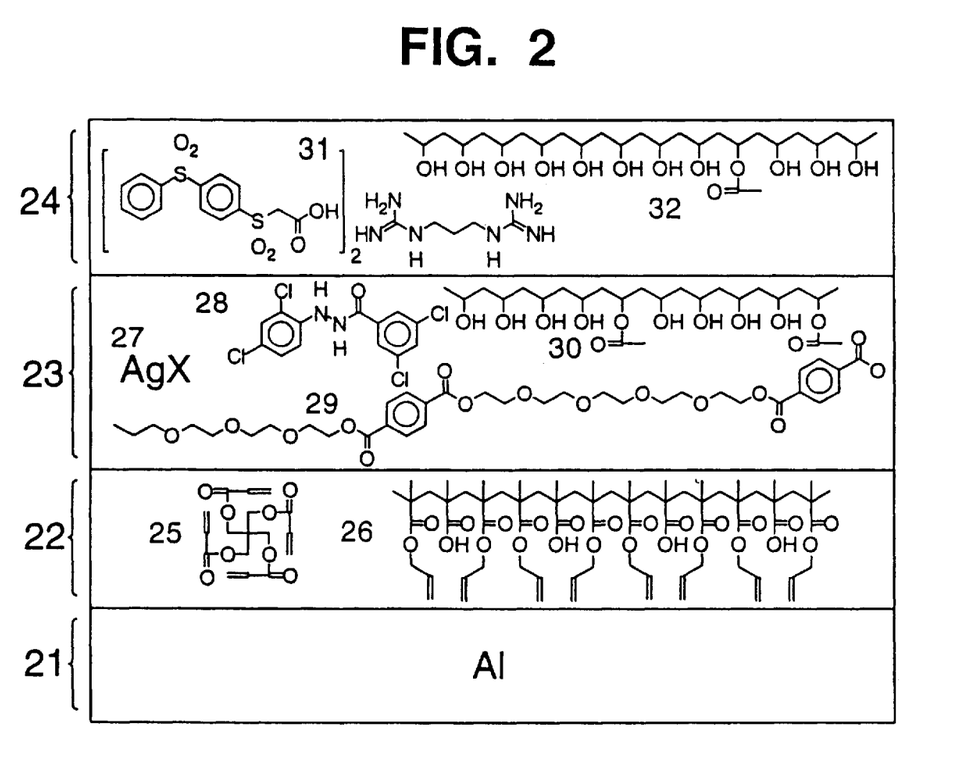
FIG. 2 is a sectional view schematically illustrating another preferred embodiment of a silver halide light-sensitive material.

FIG. 2 is a sectional view schematically illustrating another preferred embodiment of a silver halide light-sensitive material.

The light-sensitive material shown in FIG. 2 comprises an aluminum support (21), a hardening layer (22), a light-sensitive layer (23) and an image formation accelerating layer (24) in the order. The hardening layer (22) contains an ethylenically unsaturated polymerizable compound (25) and an ethylenically unsaturated cross-linkable polymer having an acidic group (26). The light-sensitive layer (23) contains silver halide (27), a reducing agent (28), a water-soluble synthetic polymer (29) and a hydrophilic polymer (30). The image formation accelerating layer (24) contains a base precursor (31) and a hydrophilic polymer (32).

[Support]

The support can be made of a paper, a synthetic paper, a paper laminated with a synthetic resin (e.g., polyethylene, polypropylene, polystyrene), a plastic (e.g., polyethylene terephthalate, polycarbonate, polyimide, Nylon, cellulose triacetate) film, a metal (e.g., aluminum, aluminum alloy, zinc, iron, copper) plate or a paper or plastic film laminated with the metal. Further, the metal can be evaporated onto the paper or plastic film to form the support.

In the case that the light-sensitive material is used for the preparation of a lithographic plate, the support is preferably made of an aluminum plate, a polyethylene terephthalate film, a polycarbonate film, a paper or a synthetic paper. A complex sheet can also be used as the support. For example, an aluminum sheet can be laminated on the polyethylene terephthalate film.

An aluminum support is particularly preferred. The aluminum support preferably has a thickness in the range of 0.1 to 0.5 mm.

The aluminum support is preferably treated to form a rough surface (graining treatment) or a hydrophilic surface.

The treatment for the rough surface can be conducted by an electrochemical graining treatment and/or a mechanical graining treatment. According to the electrochemical graining treatment, a current passes through an aluminum plate in an electrolytic solution of hydrochloric acid or nitric acid. The mechanical graining treatment includes a wire brushing method, a ball graining method and a brash graining method. In the wire brushing method, the surface of aluminum plate is scratched with a metal wire. In the ball graining method, the surface of aluminum plate is grained with graining balls and a graining agent. In the brash graining method, the surface is grained with a Nylon brash and a graining agent.

The grained aluminum plate is then chemically etched with an alkali or an acid. An alkali etching method is industrially advantageous. Examples of the alkali agents include sodium carbonate, sodium aluminate, sodium metasilicate, sodium phosphate, sodium hydroxide, potassium hydroxide and lithium hydroxide. The alkali solution preferably has a concentration in the range of 1 to 50 wt.%. The temperature of the alkali treatment is preferably in the range of 20° to 100° C. The treatment conditions are preferably so adjusted that the amount of the dissolved aluminum is in the range of 5 to 20 g per m$^2$.

The aluminum plate is usually washed with an acid to remove smut from the surface after the alkali etching treatment. Examples of the acids include nitric acid, sulfuric acid, phosphoric acid, chromic acid, hydrofluoric acid and borofluoric acid.

The smut removing treatment can also be conducted according to a conventional method after the electrochemical graining treatment. For example, an aluminum plate can be treated with 15 to 65 wt.% sulfuric acid at a temperature in the range of 50° to 90 C.

The surface treated aluminum plate can be subjected to an anodizing treatment or a chemical treatment. The anodizing treatment can be conducted according to a conventional method. In more detail, a direct or alternative current passes through an aluminum plate in a solution of an acid to form an anodic oxide layer on the surface of the plate. Examples of the acids include sulfuric acid, phosphoric acid, chromic acid, oxalic acid, sulfamic acid and benzenesulfonic acid. The conditions of the anodizing treatment depend on the contents of the electrolytic solution. The concentration of the electrolytic solution is preferably in the range of 1 to 80 wt.%, the temperature of the solution is preferably in the range of 5° to 70°C., the current density is preferably in the range of 0.5 to 60 A/dm2, the voltage is preferably in the range of 1 to 100 v, and the time for the electrolysis is preferably in the range of 10 to 100 seconds.

The anodizing treatment is preferably conducted in sulfuric acid at a high current density. Phosphoric acid is also preferably used for the anodizing treatment.

After the anodizing treatment, the aluminum plate can be treated with an alkali metal silicate. For example, the aluminum plate can be immersed in an aqueous solution of sodium silicate. An undercoating layer can be provided on the aluminum support to improve the adhesion between the support and the hardening layer or to improve a printing character.

[Undercoating layer]

An undercoating layer (hydrophilic layer) can be provided on not only the above-mentioned aluminum support, but also a support having a hydrophobic (or not sufficiently hydrophilic) surface (e.g., a polymer film).

Examples of the components of the undercoating layer include a polymer (e.g., gelatin, casein, polyvinyl alcohol, ethyl cellulose, phenol resin, styrene-maleic anhydride resin, polyacrylic acid), an amine (e.g., monoethanol amine, diethanol amine, triethanol amine, tripropanol amine) and a salt thereof (e.g., chloride, oxalate, phosphate), an monoaminomonocarboxylic acid (e.g., aminoacetic acid, alanine), an oxyamino acid (e.g., serine, threonine, dihydroxyethylglycine), a sulfur containing amino acid (e.g., cysteine, cystine), a monoaminodicarboxylic acid (e.g., aspartic acid, glutamic acid), an aromatic amino acid (e.g., p-hydroxylphenylglycine, phenylalanine, anthranilic acid), an aliphatic aminosulfonic acid (e.g., sulfamic acid, cyclohexylsulfamic acid) and a (poly)aminopolyacetic acid (e.g., ethylenediaminetetraacetic acid, nitrilotriacetic acid, iminodiacetic acid, hydroxyethyliminodiacetic acid, hydroxyethylethylenediamineacetic acid, ethylenediaminediacetic acid, cycloethylenediaminetetraacetic acid, diethylenetriaminepentaaceitic acid, glycoletherdiaminetetraacetic acid). All or a part of the acidic groups of the above-mentioned compound may form-a salt (e.g., sodium salt, potassium salt, ammonium salt). Two or more components can be used in combination.

In the case that a polymer film is used as a support, hydrophilic fine particles (e.g., silica particles) are preferably added to a hydrophilic undercoating layer in place of the graining treatment of an aluminum support.

[Hardening layer]

The hardening layer contains an ethylenically unsaturated polymerizable compound or an ethylenically unsaturated cross-linkable polymer. The layer preferably contains the polymerizable compound and the cross-linkable polymer.

The amount of the ethylenically unsaturated polymerizable compound is preferably in the range of 3 to 200 wt.%, and more preferably in the range of 10 to 100 wt.% based on the amount of the cross-linkable polymer.

The amount of the cross-linkable polymer is preferably in the range of 30 to 95 wt.%, and more preferably in the range of 50 to 90 wt.% based on the amount of the hardening layer.

The hardening layer preferably has a thickness in the range of 0.1 to 20 μm, and more preferably in the range of 0.3 to 7 μm.

[Adhesive layer]

The adhesive layer contains the above-mentioned water-soluble synthetic polymer.

[Light-sensitive layer]

The light-sensitive layer contains silver halide and a hydrophilic polymer.

The coating amount of silver halide is preferably in the range of 0.01 to 5 g per m$^2$, more preferably in the range of 0.03 to 1 g per m$^2$, and most preferably in the range of 0.05 to 0.3 g per m$^2$.

The light-sensitive layer preferably has a thickness in the range of 0.07 to 13 μm, and more preferably in the range of 0.2 to 5 μm.

[Overcoating layer and image formation accelerating layer]

An overcoating layer has a function of preventing oxygen in the air from permeating into the hardening layer. Oxygen functions as a polymerization inhibitor. The overcoating layer can function as a protective layer. The overcoating layer can also function as an image formation accelerating layer, which contains a component (e.g., a base, a base precursor, a reducing agent, a heat development accelerator) that accelerates an image forming reaction.

The overcoating layer or the image formation accelerating layer preferably has a thickness in the range of 0.3 to 20 μm, more preferably in the range of 0.5 to 7 μm.

[Intermediate layer]

An intermediate layer can be provided between the layers.

The intermediate layer can function as an antihalation layer a filter layer or a barrier layer. The antihalation layer or the filter layer is a functional layer containing a dye. The barrier layer prevents components from moving between layers when the light-sensitive material is stored. The composition of the intermediate layer is determined according to its function.

The intermediate layer preferably has a thickness of not more than 10 μm.

[Silver halide]

Silver halide is silver chloride, silver bromide, silver iodide, silver chlorobromide, silver chloroiodide, silver iodobromide or silver chloroiodobromide in the form of grains.

The crystal forms of silver halide grains preferably are cubic or tetradecahedron. Irregular forms and mixed forms as well as the above mentioned regular forms can be used in the silver halide emulsions. Examples of the irregular forms include a potato-like form, a spherical form and a tabular form. The tabular form usually has an aspect ratio (diameter per thickness) of 5 or more.

The silver halide grains may be extremely small grains having a grain diameter (diameter of projected area) of less than 0.01 μm. The grains may also be relatively large grains having a diameter of more 10 μm. A monodispersed emulsion is preferred to a polydispersed emulsion. The monodispersed emulsion is described in U.S. Pat. Nos. 3,574,628, 3,655,394 and British Patent No. 1,413,748.

With respect to the crystal structure of the silver halide grains, the individual grains have a homogeneous halogen composition or a heterogeneous halogen composition. In the heterogeneous composition, the composition varies from the outer surface portion to the inside portion. The grains may have a multi-layered structure. Further, the silver halide grains may be conjugated with other silver halide grains having different halogen composition through epitaxial conjugation. The grains may be conjugated with compounds other than the silver halide such as silver rhodanate and lead oxide.

Various substances in the form of salt can be added to the silver halide grains. Examples of the substances include copper, thallium, lead, cadmium, zinc, chalcogens (e.g., sulfur, selenium, tellurium), gold, and noble metals of group VIII (e.g., rhodium, iridium, iron, platinum, palladium). he salts are added to the emulsion at the grain formation or after the grain formation according to a conventional process. The conventional process is described in U.S. Pat. Nos. 1,195,432, 1,191,933, 2,448,060, 2,628,167, 2,950,972, 3,488,709, 3,737,313, 3,772,031, 4,269,927 and Research Disclosure (RD), No. 13,452 (June 1975).

The silver halide grains can be doped with iridium ion by adding an aqueous solution of an iridium compound to a silver halide emulsion. Examples of water-soluble iridium compounds include hexachloroiridic (III) salts and hexachloroiridic (IV) salts. The silver halide grains can also be doped with rhodium ion by adding an aqueous solution of a rhodium compound to a silver halide emulsion. Examples of water-soluble rhodium compounds include rhodium ammonium chloride, rhodium trichloride and rhodium chloride.

The iridium compound or the rhodium compound can be dissolved in a halide solution for forming silver halide grains. The aqueous solution of the iridium compound or the rhodium compound can be used before or after the grain formation. Further, the solution can be added to the emulsion between the grain formation and a chemical sensitization. The solution is preferably added at the stage of the grain formation. The iridium or rhodium ion is preferably used in an amount of $10^{-8}$ to $10^{-3}$ mol, and more preferably in an amount of $10^{-7}$ to $10^{-5}$ mol based on 1 mol of silver halide.

Two or more kinds of silver halide grains that differ in halogen composition, crystal habit, grain size, or other features from each other can be used in combination.

The silver halide is preferably used in the form of an emulsion. The silver halide emulsion can be prepared by known processes, which are described in Research Disclosure (RD), No. 17,643, pages 22 to 23 (December 1978), (Emulsion preparation and types); and Research Disclosure, No. 18,716, page 648, (November 1979).

The silver halide emulsion is generally used after a physical ripening and a chemical sensitization. The silver halide grains preferably have a low fogging value.

Various additives can be used in the ripening or sensitizing steps. The additives are described in Research Disclosure, No. 17,643 and No. 18,716. The chemical sensitizer is described in No. 17,643 (page 23) and No. 18,716 (page 648, right column). Other additives are also described in Research Disclosure. For example, a sensitivity-increasing agent is described in No. 18,716 (page 648, right column). An anti-fogging agent and a stabilizer are described in No. 17,643 (pages 24 to 25) and No. 18,716 (page 649, right column), respectively.

The silver halide emulsion is usually subjected to a spectral sensitization. Various spectral sensitizing dyes are known in a conventional silver halide photography. Examples of the sensitizing dyes include cyanine dyes, merocyanine dyes, complex merocyanine dyes, holopolar cyanine dyes, hemicyanine dyes, styryl dyes and hemioxonol dyes.

The spectral sensitizing dyes can be used to adjust the spectral sensitivity of the light-sensitive material to wavelength of two or more light sources such as various laser beams (e.g., semiconductor laser, helium neon laser, argon ion laser, helium cadmium laser, YAG laser) and a light emission diode. For example, two or more sensitizing dyes are used for silver halide grains in a light-sensitive layer so that a light-sensitive material can be exposed to two or more light sources.

A supersensitizer can be added to the emulsion in addition to the sensitizing dye. The supersensitizer itself has neither a spectral sensitization effect nor an absorption of visible light, but shows a supersensitizing effect on the sensitizing dye.

The spectral sensitizing dyes are described in Research Disclosure No. 17643 (December 1978), pages 23 to 24. The supersensitizers are described in Research Disclosure No. 18716 (November 1979), page 649.

[Organic metallic salt]

An organic metallic salt can be added to the light-sensitive layer containing silver halide. An organic silver salt is particularly preferred.

Examples of organic moieties of the salts include triazoles, tetrazoles, imidazoles, indazoles, thiazoles, thiadiazoles, azaindenes. An aliphatic, aromatic or heterocyclic compound having a mercapto group can also be used as the organic moiety. Further, silver carboxylates and acetylene silver can be used as the organic silver salt. Two or more organic metallic salts can be used in combination.

The organic silver salt is generally used in an amount of $10^{-5}$ to 10 mol, and preferably $10^{-4}$ to 1 mol based on 1 mol of silver halide.

[Reducing agent]

The reducing agent has a function of reducing the silver halide or a function of accelerating a hardening reaction of a polymerizable compound or a cross-linkable polymer.

Examples of the reducing agents include hydrazines, hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o-or p-sulfonamidonaphthols, 2,4-disulfonamidephenols, 2,4-disulfonamidenaphthols, o- or p-acylaminophenols, 2-sulfonamidoindanones, 4-sulfonamido-5-pyrazolones, 3-sulfonamidoindoles, sulfonamidopyrazolobenzimidazoles, sulfonamidopyrazolotriazoles and α-sulfonamidoketones.

The reducing agents (including compounds referred to as developing agent or hydrazine derivative) are described in Japanese Patent Provisional Publication Nos. 61(1986)-183640, 61(1986)-183535, 61(1986)-228441, 62(1987)-70836, 61(1987)-86354, 62(1987)-86355, 62(1987)-206540, 62(1987)- 264041, 62(1987)-109437, 63(1988)-254442, 1(1989)-267536, 2(1990)-141756, 2(1990)-141757, 2(1990)-207254, 2(1990)-262662 and 2(1990)-269352. The reducing agents are also described in T. James, The Theory of the Photographic Process, 4th edition, pages 291 to 334 (1977), Research Disclosure, Vol. 170, No. 17029, pages 9 to 15 (June 1978), and Research Disclosure, Vol. 176, No. 17643, pages 22 to 31 (December 1978). Further, a reducing agent precursor can be used as the reducing agent. The precursor (described in Japanese Patent Provisional Publication No. 62(1987)-210446) can release a reducing agent under heating or in contact with a base.

When the reducing agent is basic, that is, it forms a salt with an acid, the reducing agent can be used in the form of a salt with an acid. The reducing agents can be used singly or in combination. Certain interactions between those reducing agents may be expected where two or more reducing agents are used in combination. One of the interactions is for an acceleration of reduction of silver halide (or an organic silver salt) through so-called super-additivity. The other interaction is for a chain reaction between an oxidant of one reducing agent formed by a reduction of silver halide (or an organic silver salt) oxidation-reduction reaction and another reducing agent. The chain reaction induces the polymerization of the polymerizable compound.

The reducing agent is used in an amount of 0.1 to 10 mol, and more preferably 0.25 to 2.5 mol based on 1 mol of silver halide.

[Antifogging agent, silver development accelerator, stabilizer]

The light-sensitive material can contain an antifogging agent, a silver development accelerator or a stabilizer. Examples of these compounds include mercapto compounds (described in Japanese Patent Provisional Publication No. 59(1984)-111636), azoles or azaindenes (described in Research Disclosure No. 17643 (1978), pages 24 to 25), nitrogen-containing carboxylic acids or the phosphoric acids (described in Japanese Patent Provisional Publication No. 59(1984)-168442), acetylene compounds (described in Japanese Patent Provisional Publication No. 62(1987)-87957) and sulfonamides (described in Japanese Patent Provisional Publication No. 61(1987)-178232).

An aromatic (a carbon or heterocyclic ring) mercapto compound can also be used as an antifogging agent or a silver development accelerator. An aromatic heterocyclic mercapto compound, particularly a mercapto triazole derivative is preferred. The mercapto compound can be used in the form of a mercapto silver (silver salt).

These compounds are generally used in an amount of $10^7$ to 1 mol based on 1 mol of the silver halide.

[Hydrophilic polymer]

A hydrophilic polymer is used as a binder of a hydrophilic layer, such as a light-sensitive layer, an image formation accelerating layer, an overcoating layer and an intermediate layer.

The hydrophilic binder has a hydrophilic group or a hydrophilic bond in its molecule. Examples of the hydrophilic group include carboxyl, hydroxyl (including alcohol and phenol), sulfo, sulfonamido, sulfonimido and amido. Examples of the hydrophilic bond include urethane bond, ether bond and amido bond.

The hydrophilic binder preferably is soluble in water or swells in water. The polymer that swells in water has an affinity with water, but is not soluble in water because of the cross-linking structure of the polymer.

Natural or synthetic polymers can be used as the hydrophilic binder. The hydrophilic polymers are described in Japanese Patent Provisional Publication No. 5(1993)-249667.

Polyvinyl alcohol is a particularly preferred hydrophilic polymer. Polyvinyl alcohol preferably has a high saponification degree of not lower than 70%, more preferably of not lower than 80%, most preferably of not lower than 95%. The polyvinyl alcohol having the high saponification degree has a very low transmission coefficient of oxygen.

Polyvinyl alcohol may be denatured by copolymerization with another monomer. A copolymer of vinyl acetate and another monomer is saponified to form the denatured polyvinyl alcohol. Examples of the monomer copolymerized with the vinyl acetate include ethylene, vinyl higher carboxylate, a higher alkyl vinyl ether, methyl methacrylate and acrylamide.

Polyvinyl alcohol may also be denatured after the saponification. Hydroxyl in polyvinyl alcohol can be modified by etheration, esterification or acetylation.

A cross-linked polyvinyl alcohol can also be used. Examples of the cross-linking agents include aldehydes, methylol compounds, epoxy compounds, diisocyanates, divinyl compounds, dicarboxylic acids and inorganic cross-linking agents (e.g., boric acids).

The molecular weight of the hydrophilic polymer is preferably in the range of 3,000 to 500,000.

[Ethylenically unsaturated polymerizable compound]

The polymerizable compound used in the present invention has an ethylenically unsaturated group.

Examples of the ethylenically unsaturated polymerizable compounds include acrylic acids, salts thereof, acrylic esters, acrylamides, methacrylic acids, salts thereof, methacrylic esters, methacrylamides, maleic anhydride, maleic esters, itaconic esters, styrenes, vinyl ethers, vinyl esters, N-vinyl heterocyclic compounds, allyl ethers, allyl esters, and derivatives thereof.

Acrylic esters and methacrylic esters are preferred. Examples of the (meth)acrylic esters include pentaerythritol tetra(meth)acrylate, trimethylolpropane tri(meth)acrylate, dipentaerythritol hexa(meth)acrylate, polyester (meth)acrylate and polyurethane (meth)acrylate.

Two or more ethylenically unsaturated polymerizable compounds can be used in combination.

[Hydrophobic polymer]

The hardening layer preferably contains an ethylenically unsaturated cross-linkable polymer, which has a cross-linkable functional group. The cross-linkable functional group can be introduced into the main chain or side chain of the polymer molecule. The cross-linkable functional group can also be introduced into the polymer by copolymerization.

Examples of the polymer having an ethylenically unsaturated bond in its main chain include poly-1,4-butadiene, poly-1,4-isoprene and natural or synthetic rubbers. Examples of the polymer having an ethylenically unsaturated bond in its side chain include polymers of acrylic or methacrylic ester or amide having a specific residue, which means R of —COOR (ester) or —CONHR (amide). Examples of the specific residues include —$(CH_2)_n$—$CR^1$=$CR^2R^3$, —$(CH_2O)_n$—$CH_2CR^1$=$CR^2R^3$, —$(CH_2CH_2O)_n$—$CH_2CR^1$=$CR^2R^3$, —$(CH_2)_n$—NH—CO—O—$CH_2CR^1$=$CR^2R^3$, —$(CH_2)_n$—O—CO—$CR^1$=$CR^2R^3$ and —$(CH_2CH_2O)_n$-X. In the formulas, each of $R^1$, $R^2$ and $R^3$ independently is hydrogen, a halogen atom, an alkyl group, an aryl group, an alkoxy group and aryloxy group. The number of the carbon atoms contained in $R^1$, $R^2$ or $R^3$ is not more than 20. $R^1$ and $R^2$ or $R^3$ may be combined to form a ring. In the formulas, n is an integer of 1 to 10. X is dicyclopentadienyl.

Examples of the ester residues include —$CH_2CH$=$CH_2$ (described in Japanese Patent Publication No. 7(1995)-21633), —$CH_2CH_2O$—$CH_2CH$=$CH_2$, —$CH_2C(CH_3)$=$CH_2$, —$CH_2CH$=$CH$—$C_6H_5$, —$CH_2CH_2OCOCH$=$CH$—$C_6H_5$, —$CH_2CH_2$—NHCOO—$CH_2CH$=$CH_2$ and —$CH_2CH_2O$—X (wherein X is dicyclopentadienyl). Examples of the amide residues include —$CH_2CH$=$CH_2$, —$CH_2CH_2$-1-Y (wherein Y is cyclohexene) and —$CH_2CH_2$—OCO—$CH$=$CH_2$.

The cross-linkable polymer is hardened by adding a free radical to the unsaturated bond (or group). The free radical functions as a polymerization initiator or a chain extender. The polymers are cross-linked with each other directly or by a chain reaction of a polymerizable compound. The polymer can also be cross-linked by a reaction of polymer radicals, which are formed by detaching an atom of the polymers (e.g., hydrogen attached to carbon adjacent to the unsaturated bond) by a free radical.

A non-cross-linkable (or weak cross-linkable) hydrophobic polymer can be used as a binder of a hardening layer in place of the cross-linkable polymer. Examples of the non-cross-linkable hydrophobic polymers include polyacrylic esters, polymethacrylic esters (e.g., polymethyl methacrylate, polybenzyl methacrylate), polyacrylamides and polymethacrylamides. These polymers have a saturated aliphatic residue or an aromatic residue in place of the above-mentioned ethylenically unsaturated residue (R).

Other examples of non-cross-linkable polymers include polyacrylic esters, polymethacrylic esters, polyvinyl acetate, polyvinyl chloride, polyvinylidene chloride, polyacrylonitrile, polymethacrylonitrile, polyethylene, polyvinyl pyridine, polyvinyl imidazole, polyvinyl butyral, polyvinyl formal, polyvinyl pyrrolidone, chlorinated polyethylene, chlorinated polypropylene, polyesters, polyamides, polyurethanes, polycarbonates, cellulose ether (e.g., ethyl cellulose) and cellulose esters (e.g., triacetyl cellulose, diacetyl cellulose, cellulose acetate butyrate).

The above-mentioned hydrophobic (cross-linkable or non-cross-linkable) polymer preferably has an acidic group. Examples of the acidic functional groups include carboxyl, an acid anhydride group, phenolic hydroxyl, sulfo, sulfonamido and sulfonimido. The acidic functional groups can be introduced into the polymer by copolymerization with an acidic monomer. Examples of the acidic monomers include acrylic acid, methacrylic acid, styrenesulfonic acid and maleic anhydride. The amount of the monomer having the acidic functional group in the copolymer is preferably in the range of 1 to 60 mol %, more preferably in the range of 5 to 50 mol %, and most preferably in the range of 10 40 mol %.

The molecular weight of the hydrophobic polymer is preferably in the range of 1,000 to 500,000. Two or more polymers may be used in combination.

[Base or base precursor]

The light-sensitive material preferably contains a base or base precursor.

Various organic or inorganic bases and their precursors (e.g., decarboxylation type, thermal decomposition type, reaction type, complex salt-formation type, dissociation type) can be used in the light-sensitive material. A base precursor is preferred to a base in view of stability of the light-sensitive material.

An example of the decarboxylation type base precursor is a salt of an organic acid with a base that is decarboxylated under heating (described in Japanese Patent Provisional Publication Nos. 59(1984)-180537, 61(1986)-313431, 63(1988)-316760, 64(1989)-68746). An example of the thermal decomposition type base precursor is a urea compound (described in Japanese Patent Provisional Publication No. 63(1988)-96159). An example of the reaction type base precursor is a transition metal acetylide (described in Japanese Patent Provisional Publication No. 63(1998)-25208). An example of the complex salt-formation type base precursor is a water-insoluble basic metal compound (described in Japanese Patent Provisional Publication No. 1(1989)-3282). An example of the dissociation type base precursor is an alkali metal salt of an organic acid (e.g., sodium acetate, sodium salt of a polymer having an acidic group).

The base precursor preferably releases a base at a temperature in the range of 50° to 200° C., and more preferably in the range of 80° to 160° C.

The base or the base precursor is preferably used-in an amount of preferably 0.1 to 20 mol, and more preferably 0.2 to 10 mol based on 1 mol of silver halide.

[Heat development accelerator]

The light-sensitive material can contain a heat development accelerator. The heat development accelerator may be added to any layers of the light-sensitive material. The heat development accelerator has a function of increasing the plasticity of a polymer (contained in the hardening layer or the light-sensitive layer). The accelerator has another function of accelerating the dispersion of the components in the layers when it is dissolved by heat of the development process.

The heat development accelerator has been known as a plasticizer. The known plasticizers are described in Plastic Additives (written in Japanese), pages 21 to 63 (Taisei-sha); Plastics Additives, Second Edition; Hanser Publishers, Chapter 5, pages 251 to 296.

Examples of the heat development accelerators include polyethers (e.g., polyethylene glycol, polypropylene glycol), polyhydric alcohols (e.g., glycerol, hexanediol), saccharides (e.g., sorbitol), formic esters, ureas (e.g., urea, diethylurea, ethyleneurea), amides (e.g., acetamide, propionamide, malonamide), sulfonamides, urea resins and phenol resins. Two or more heat development accelerators can be used in combination. The heat development accelerators can be added to two or more layers of the light-sensitive material.

The amount of the heat development accelerator is preferably in the range of 0.05 to 2 g per m$^2$, and more preferably in the range of 0.1 to 1 g per m$^2$.

[Colorant]

The light-sensitive material can contain a colorant. The colorant can functions as an antihalation or antiirradiation dye. Further, a hardened image can be colored with the colorant. Various known dyes and pigments can be used as the colorant provided that the colorant does not affect the sensitivity and the developing reaction of silver halide. The hue of the antihalation or antiirradiation dye is preferably adjusted within the sensitive light region of silver halide.

The colorants (dyes, pigments, colloidal silvers) are described in various publications such as Japanese Patent Provisional Publication No. 5(1993)-249667, Handbook of Color Index and New Handbook of Pigments, Nippon Ganryo Gijutsu Kyokai (1970).

The antiirradiation dyes having little effects on the sensitivity of silver halide are described in Japanese Patent Publication Nos. 41(1966)-20389, 43(1968)-3504, 43(1968)-13168, Japanese Provisional Publication No. 2(1990)-39042, U.S. Pat, Nos. 2,865,752, 3,423,207, 3,697,037, and British Patent Nos. 1,030,392, 1,100,546.

The amount of the colorant is usually in the range of 0.01 to 2 g per m$^2$, and preferably in the range of 0.05 to 1 g per m$^2$.

[Development stopping agent]

The development stopping agent can be used in the light-sensitive material to obtain a clear image constantly regardless of the temperature and time for the development process. The development stopping agent can be a compound having a function of neutralizing a base or reacting with a base to reduce the base concentration in the layer to stop development. The agent can also be a compound having a function of mutually reacting with silver or a silver salt to suppress development, after the appropriate development.

Examples of the development stopping agents include acid precursors capable of releasing acids upon heating, electrophilic compounds capable of undergoing substitution reaction with a coexisting base upon heating, nitrogen-containing heterocyclic compounds, mercapto compounds, and precursors thereof. The development stopping agents are described in Japanese Patent Provisional Publication Nos. 62(1987)-253159, 2(1990)-42447 and 2(1990)-262661.

[Surface active agent]

A surface active agent can be added to a layer of the light-sensitive material. Various nonionic, anionic, cationic or fluorine surface active agents can be used. The surface active agent is described in Japanese Patent Provisional Publication No. 2(1990)-195356. Sorbitan, polyoxyethylene and a fluorine-containing compound are preferred.

[Matting agent]

A matting agent can be added to a back layer, an over-coating layer or an image formation accelerating layer to prevent adhesion of between two light-sensitive materials when the materials are superposed.

Inorganic or organic solid particles can be used as the matting agent. Examples of the matting agents include oxides (e.g., silicon dioxide), alkali earth metal salts, natural polymers (e.g., starch, cellulose) and synthetic polymers.

The average particle size of the matting agent is preferably in the range of 1 to 50 $\mu$m. The amount of the matting agent is preferably in the range of 0.01 to 1 g per m$^2$.

[Polymerization inhibitor]

A polymerization inhibitor can be added to the polymerizable layer to prevent a polymerization reaction while storing the light-sensitive material. Examples of the polymerization inhibitors include nitrosoamines, ureas, thioureas, thioamides, phenols and amines.

[Exposing step]

The silver halide light-sensitive is imagewise exposed to light.

The wavelength of the light corresponds to the spectral sensitivity of silver halide. The wavelength is usually within the visible, near ultraviolet and near infrared regions. A X-ray and an electron bean can also be used as the light.

Examples of the light sources include a tungsten lamp, a halogen lamp, a xenon lamp, a xenon flash lamp, a mercury lamp, a carbon arc lamp, various laser means (e.g., semiconductor laser, helium neon laser, argon ion laser, helium cadmium laser), light emitting diode and cathode-ray tube.

The amount of the exposure is usually in the range of 0.001 to 1,000 $\mu$J/cm$^2$, and preferably in the range of 0.01 to 100 $\mu$J/cm$^2$. The light-sensitive material can be exposed to light through a transparent support.

The exposure of silver halide, namely formation of latent image is influenced with the temperature and humidity at the exposing step. Accordingly, the sensitivity depends on the temperature and humidity. Therefore, the temperature and the humidity under the circumstances of the light source and the light-sensitive material are preferably controlled at constant values. An image recording apparatus having a controlling device is disclosed in Japanese Patent Provisional Publication Nos. 3(1991)-63143 and 3(1991)-63637.

[Developing step]

The light-sensitive material is developed simultaneously with or after the exposing step. The light-sensitive material is preferably heated to develop the silver halide.

The heat development can be conducted by placing the light-sensitive material on a heated material (e.g., metal plate, block, roller). The light-sensitive material may be immersed in a heated liquid for the development. Further, the light-sensitive material may be irradiated with an infrared ray.

The surface of the light-sensitive material may be open to the air while heating the material from the side of the support. The surface of the light-sensitive material may be covered with the heating means to prevent the air from penetrating into the layers. In the case that the surface is open to the air, a layer of the light-sensitive material preferably contains a polymer having a function of prevent the air from penetrating into the layers.

The heating temperature is preferably in the range of 60° to 200° C., and more preferably in the range of 100° to 150° C. The heating time is preferably in the range of 1 to 180 seconds, and more preferably in the range of 5 to 60 seconds.

A preheat treatment or post-heat treatment can be conducted before or after the heat development. The temperature of the preheat is lower than the heat development temperature, and the time is shorter than the development time. The post-heat treatment can be conducted after the image is formed, for example after removing the unhardened hardening layer.

[Removing step]

The unhardened area can be selectively removed to form a polymer image based on a difference in the solubility between the hardened area and the unhardened area. Before the removing step, hydrophilic layers (light-sensitive layer, adhesive layer, image formation accelerating layer) are preferably removed from the light-sensitive material.

The light-sensitive material is immersed in a solvent (an etching solution) to conduct the removing step. An alkaline solution is preferably used as the solvent.

Examples of the alkaline compound include sodium hydroxide, potassium hydroxide, sodium carbonate, sodium silicate, potassium silicate, sodium metasilicate, potassium metasilicate, sodium phosphate, potassium silicate, ammonia and aminoalcohols (e.g., monoethanolamine, diethanolamine, triethanolamine).

The solvent preferably is water. An organic solvent can be used in combination with water. An alcohol and an ether are preferably used as the organic solvent. Examples of the alcohols include lower alcohols (e.g., methanol, ethanol, propanol, butanol), alcohols having an aromatic group (e.g., benzyl alcohol, phenethyl alcohol), polyhydric alcohols (e.g., ethylene glycol, diethylene glycol, triethylene glycol, polyethylene glycol) and aminoalcohols described above as the alkaline compounds. Examples of the ethers are cellosolves.

The solvent may further contain the other additives such as a surface active agent and a defoaming agent.

The obtained image can be used as a printing plate, a color proof, a hard copy or a relief image.

[Use of silver halide light-sensitive material]

The silver halide light-sensitive material can be used to prepare a hard copy, a relief image or a printing plate. The light-sensitive material of the present invention is advantageously used for the preparation of a printing plate.

EXAMPLE 1

Preparation of aluminum support

A surface of an aluminum plate (according to JIS-A-1050) having the thickness of 0.24 mm was ground using a nylon brush and an aqueous suspension of pumice stone of 400 mesh. The plate was well washed out with water. The aluminum plate was then immersed for etching in 10% aqueous solution of sodium hydroxide at 70° C. for 60 seconds. The plate was washed out with running water, then neutralized with 20% aqueous solution of nitric acid and washed out with water.

The obtained aluminum plate was subjected to an electrolytic surface-roughening treatment in 1% aqueous solution of nitric acid containing 0.5% aluminum nitrate in an anodically electric amount of 160 coulomb per $dm^2$ using sine wave alternating-corrugated current under such conditions as an anodic voltage of 12.7 V and a cathodically electric amount ratio to an anodically electric amount of 0.9. The center line average height (Ra) of the aluminum plate was 0.6 $\mu$m.

The aluminum plate was immersed in 1% aqueous solution of sodium hydroxide at 40° C. for 30 seconds. The plate was then immersed in 30% sulfuric acid at 55° C. for 1 minute. Further, the plate was subjected to anodizing treatment in 20% aqueous solution of sulfuric acid at a current density of 2 A per $dm^2$ to form an anodic oxide layer having the thickness of 2.5 g per $dm^2$. The plate was washed with water and dried to obtain an aluminum support.

Preparation of pigment dispersion

The following pigment dispersion was prepared.

| Pigment dispersion | |
| --- | --- |
| Copper phthalocyanine | 15 g |
| Allyl methacrylate/methacrylic acid copolymer (copolymerization ratio = 80/20) | 15 g |
| Methyl ethyl ketone | 70 g |

Formation of hardening layer

The following coating solution was coated and dried on the support to form a hardening layer having the dry thickness of 1.8 $\mu$m.

| Coating solution of hardening layer | |
| --- | --- |
| Pentaerythritol tetraacrylate | 2.0 g |
| Allyl methacrylate/methacrylic acid copolymer (copolymerization ratio = 70/30) | 4.0 g |
| Propylene glycol monomethyl ether | 36.0 g |
| The pigment dispersion | 18.0 g |

Formation of adhesive layer

The following coating solution was coated and dried on the hardening layer to form an adhesive layer having the dry thickness of 0.05 $\mu$m (dry coating amount: 0.05 g per $m^2$). In the synthesis of the polymer comprising the repeating unit (I-2), the amount of the dicarboxylic acid was 1 wt.% (about 100 mol %) based on the amount of the diol. The weight ratio of the alkylene oxide units having hydrogen atom as R to the alkylene oxide units having methyl as R was 80:20.

| Coating solution of adhesive layer | |
| --- | --- |
| Water | 180 g |
| 10 Wt. % aqueous solution of a polymer comprising the repeating unit (I-2) | 6.5 g |
| 5 Wt. % aqueous solution of the following surface active agent | 2.0 g |

(Surface active agent)

Preparation of silver halide emulsion

Gelatin, potassium bromide and water were placed in a vessel and adjusted to pH 9.5 at the room temperature. After the mixture in the vessel was heated to 55° C., the following thioether compound ($2.0 \times 10^{-3}$ mol based on the total amount of silver nitrate) was added to the vessel. Further, an aqueous solution of silver nitrate and an aqueous solution of potassium bromide containing a rhodium ammonium chloride (the molar ratio of rhodium to the total amount of potassium iodide and silver nitrate is $4 \times 10^{-8}$ mol) were added to the vessel according to a pAg controlled double jet method while keeping the pAg of 9.0 in the reaction vessel to prepare a silver iodobromide emulsion. The emulsion was adjusted to pH 6.0 using sulfuric acid. Further, a potassium bromide solution containing hexachloroiridate (III) salt (the molar ratio of iridium to silver is $5 \times 10^{-7}$ mol) was twice added to the emulsion at 55° C. and pAg 9.3 according to a double jet method to obtain a core/shell type silver iodobromide emulsion having the following composition.

(Thioether compound)

Core: Silver iodobromide (silver iodide content: 8.5 mol%)
Shell: Pure silver bromide
Core/shell: 3/7 (molar ratio of silver)
Average silver iodide content: 2.55 mol%
Average grain size: 0.30 μm

The grains of the obtained emulsion were monodispersed. In the emulsion, 98% of the grains have a grain size within the range of the average grain size ±40%.

After the emulsion was desalted, a methanol solution of the following sensitizing dyes A and B (A:B=2:1, total amount: $8 \times 10^{-4}$ mol per 1 mol of silver halide) was added to the emulsion. The emulsion was left for 20 minutes. To the emulsion, the following sodium salt of a thiol compound ($6 \times 10^{-4}$ mol per 1 mol of silver halide) was added. The emulsion was stirred for 5 minutes to prepare a silver halide emulsion.

(Sensitizing dye A)

(Sensitizing dye B)

(Sodium salt of thiol)

Preparation of reducing agent dispersion In 90 g of 10 wt.% aqueous solution of polyvinyl alcohol (Kuraray Co., Ltd.), 10 g of powder of the following reducing agent was dispersed by using a dynomill dispersing device. The particle size of the reducing agent was not larger than about 0.5 μm.

(Reducing agent)

Formation of light-sensitive layer

The following coating solution was coated and dried on the adhesive layer to form a light-sensitive layer having the dry thickness of 8 μm.

| Coating solution of light-sensitive layer | |
|---|---|
| 10 Wt. % aqueous solution of polyvinyl alcohol having the saponification degree of 79.5% (PVA-405, Kuraray Co., Ltd.) | 10.5 g |
| 0.11 Wt. % methanol solution of the following compound (S-1) | 0.41 g |
| 0.11 Wt. % methanol solution of the following compound (S-2) | 0.41 g |

-continued

| Coating solution of light-sensitive layer | |
|---|---|
| The silver halide emulsion | 0.50 g |
| 5 Wt. % aqueous solution of the surface active agent | 0.40 g |
| Water | 7.80 g |
| The reducing agent dispersion | 1.20 g |

-continued

| Coating solution of light-sensitive layer |
|---|

(S-1)

HS—[benzimidazole ring]—NH—CO—CH(C4H9)(C2H5)

Structure: 2-mercaptobenzimidazole with NH-CO-CH(C4H9)- substituent, where CH is bonded to C2H5

(S-2)

[1,3,4-thiadiazoline structure with N-CH2-CH2-phenyl and SAg group, phenyl substituent]

Preparation of base precursor dispersion

In 750 g of 3 wt.% aqueous solution of polyvinyl alcohol (PVA-205, Kuraray Co., Ltd.) was dispersed 250 g of powder of the following base precursor by using Dynomill dispersing device. The particle size of the base precursor was not larger than about 0.5 μm.

(Base precursor)

Formation of image formation accelerating layer

The following coating solution was coated and dried on the light-sensitive layer to form an image formation accelerating layer having the dry thickness of 3.5 μm.

| Coating solution of image formation accelerating layer | |
|---|---|
| 10 Wt. % aqueous solution of polyvinyl alcohol having the saponification degree of 98.5% (PVA-105, Kuraray Co., Ltd.) | 200.0 g |
| The base precursor dispersion | 1.25 g |
| 5 Wt. % aqueous solution of the surface active agent | 4.0 g |

Evaluation of adhesion between layers

The adhesion between the hardening layer and the light-sensitive layer was evaluated in the following manner.

The light-sensitive material was cut into pieces having the width of 2 cm. A commercially available adhesive tape was tightly attached on the surface of a sample piece. The tape was peeled form the piece at the range of 40 mm per minute at the direction of 180° by using a tensile testing machine (Tensilone, Orientech Co., Ltd.). The light-sensitive material was separated between the hardening layer and the light-sensitive layer. The peeling d(adhesive) force for the separation was 100 g per 2 cm.

Preparation of alkaline solution

The following alkaline solution was prepared and adjusted to pH 13.5.

| Alkaline solution | |
|---|---|
| 28 Wt. % aqueous solution of potassium silicate | 125.0 g |
| Potassium hydroxide | 15.0 g |
| Water | 750.0 g |

Image formation

The silver halide light-sensitive material was exposed to light of 670 nm through a sharp cut interference filter. The light source was a xenon flush lump. The light emission time was $10^{-4}$ second. The exposure (energy on the surface) was 2 μJ per $cm^2$.

The aluminum support of the light-sensitive material was placed on a hot plate. The material was conveyed on the plate to heat the material for 30 seconds. Thus the light-sensitive material was developed.

The light-sensitive material was washed with water to remove the image formation accelerating layer, the light-sensitive layer and the adhesive layer. The hardening layer was etched with the alkaline solution by a brush in an automatic developing machine. The light-sensitive material was well washed with water to form a blue polymer relief image within the exposed area of the hardening layer.

EXAMPLES 2 to 4 and COMPARISON EXAMPLES 1 to 11

Silver halide light-sensitive materials were prepared and evaluated in the same manner as in Example 1, except that the coating amount of the adhesive layer was changed as is shown in Table 1 (Examples 2 to 4). Further, a silver halide light-sensitive material was prepared and evaluated in the same manner as in Example 1, except that the adhesive layer was provided (Comparison example 1). Furthermore, silver halide light-sensitive materials were prepared and evaluated in the same manner as in Example 1, except that conventional adhesive polymers shown in Table 1 were used as the polymer of the adhesive layer (Comparison examples 2 to 11). The results are set forth in Table 1.

TABLE 1

| Light-sensitive material | Polymer of adhesive layer | Amount of adhesive layer | Peeling (adhesive) force | Image formation* |
|---|---|---|---|---|
| Example 1 | I-2 | 0.05 g/m² | 100 g/2cm | A |
| Example 2 | I-2 | 0.10 g/m² | 125 g/2cm | A |
| Example 3 | I-2 | 0.50 g/m² | 340 g/2cm | A |
| Example 4 | I-2 | 1.00 g/m² | 500 g/2cm | A |
| Comp. 1 | None | — | 20 g/2cm | B |
| Comp. 2 | X-1 | 0.50 g/m² | 22 g/2cm | B |
| Comp. 3 | X-2 | 0.50 g/m² | 25 g/2cm | B |
| Comp. 4 | X-3 | 0.50 g/m² | 18 g/2cm | B |
| Comp. 5 | X-4 | 0.50 g/m² | 25 g/2cm | B |
| Comp. 6 | X-5 | 0.50 g/m² | 35 g/2cm | B |
| Comp. 7 | X-6 | 0.50 g/m² | 30 g/2cm | B |
| Comp. 8 | X-7 | 0.50 g/m² | 25 g/2cm | B |
| Comp. 9 | X-8 | 0.50 g/m² | 20 g/2cm | B |
| Comp. 10 | X-9 | 0.50 g/m² | 24 g/2cm | B |
| Comp. 11 | X-10 | 0.50 g/m² | 22 g/2cm | B |

(Remark)
Image formation*:
A: No problems were observed in the image.
B: White omissions or remaining spots were observed in the image.
(X-1)

TABLE 1-continued

| Light-sensitive material | Polymer of adhesive layer | Amount of adhesive layer | Peeling (adhesive) force | Image formation* |
|---|---|---|---|---|

(X-2)

$-(CH_2-CH)_{40}- \quad -(CH_2-CH)_{20}- \quad -(CH-CH_2-CH)_{40}-$
$\quad\quad |\quad\quad\quad\quad\quad\quad |\quad\quad\quad\quad\quad\quad |\quad\quad\quad |$
$\quad\quad OH\quad\quad\quad\quad\quad OCOCH_3\quad\quad O-\!\!-\!\!CH-\!\!O$
$\quad\quad\quad\quad\quad\quad\quad\quad\quad\quad\quad\quad\quad\quad\quad\quad\quad\quad\quad\quad |$
$\quad\quad\quad\quad\quad\quad\quad\quad\quad\quad\quad\quad\quad\quad\quad\quad\quad\quad\quad\quad C_3H_7$ (X-3)

$-CH_2-CH-$
$\quad\quad\quad |$
$\quad\quad\quad OCH_3$ (X-4)

$-CH_2-CH-$
$\quad\quad\quad |$
$\quad\quad\quad CO_2H$ (X-5)

$-(CH_2-CH)_{10}- \quad -(CH_2-CH)_{90}-$
$\quad\quad |\quad\quad\quad\quad\quad\quad\quad |$
$\quad\quad CO_2CH_3\quad\quad\quad CO_2H$ (X-6)

$-CH_2-CH-$
$\quad\quad\quad |$
(pyrrolidinone ring with N and O)

(X-7)

$H-(OCH_2CH_2)_n-OH$ (X-8)

$\quad\quad\quad\quad\quad\quad\quad\quad\quad CH_3$
$\quad\quad\quad\quad\quad\quad\quad\quad\quad\quad |$
$H-(OCH_2CH_2)_{30}- \quad -(OCHCH_2)_{40}- \quad -(OCH_2CH_2)_{30}-OH$ (X-9)

$-(CH_2-CH)_{70}- \quad -(CH_2-CH)_{30}-$
$\quad\quad |\quad\quad\quad\quad\quad\quad\quad |$
$\quad\quad Cl\quad\quad\quad\quad\quad\quad COCH_3$ (X-10)

$\quad\quad\quad Cl$
$\quad\quad\quad |$
$-(CH_2-C)_{75}- \quad -(CH_2-CH)_{25}-$
$\quad\quad\quad |\quad\quad\quad\quad\quad\quad |$
$\quad\quad\quad Cl\quad\quad\quad\quad\quad CN$

EXAMPLES 5 to 10

Silver halide light-sensitive materials were prepared and evaluated in the same manner as in Example 1, except that the polymers shown in Table 2 were used as the polymer of the adhesive layer. The results are set forth in Table 2.

TABLE 2

| Light-sensitive material | Polymer** of adhesive layer | Amount of adhesive layer | Peeling (adhesive) force | Image formation* |
|---|---|---|---|---|
| Example 5 | I-1 | 0.05 g/m² | 155 g/2 cm | A |
| Example 6 | I-2' | 0.05 g/m² | 120 g/2 cm | A |
| Example 7 | I-4 | 0.05 g/m² | 140 g/2 cm | A |
| Example 8 | I-8 | 0.05 g/m² | 165 g/2 cm | A |

TABLE 2-continued

| Light-sensitive material | Polymer** of adhesive layer | Amount of adhesive layer | Peeling (adhesive) force | Image formation* |
|---|---|---|---|---|
| Example 9 | I-10 | 0.05 g/m² | 200 g/2 cm | A |
| Example 10 | I-14 | 0.05 g/m² | 180 g/2 cm | A |

(Remark)
Image formation*: A: No problems were observed in the image.
Polymer**: I-1: The amount of the dicarboxylic acid to the diol was 2 wt. % (about 100 mol %).
I-2': The amount of the dicarboxylic acid to the diol was 1 wt. % (about 100 mol %). The weight ratio of the alkylene oxide units having hydrogen atom as R to the alkylene oxide units having methyl as R was 85:15.
I-4: The amount of the dicarboxylic acid to the diol was 2 wt. % (about 120 mol %).
I-8: The amount of the dicarboxylic acid to the diol was 2 wt. % (about 200 mol %). The weight ratio of the alkylene oxide units having hydrogen atom as R to the alkylene oxide units having methyl as R was 90:10.
I-10: The amount of the diisocyanate to the diol was 1 wt. % (about 150 mol %).
I-14: The amount of the diisocyanate to the diol was 1 wt. % (about 200 mol %).

EXAMPLE 11

A hardening layer was formed on an aluminum support in the same manner as in Example 1. The following coating solution was coated on the hardening layer to form a light-sensitive layer having the dry coating amount of 1.3 g per m². An image formation accelerating layer was formed on the light-sensitive layer in the same manner as in Example 1. The obtained light-sensitive material was evaluated in the same manner as in Example 1. The results are set forth in Table 3.

| Coating solution of light-sensitive layer | |
|---|---|
| 10 Wt. % aqueous solution of polyvinyl alcohol having the saponification degree of 79.5% (PVA-405, Kuraray Co., Ltd.) | 5.25 g |
| 0.11 Wt. % methanol solution of the compound (S-1) used in Example 1 | 0.41 g |
| 0.11 Wt. % methanol solution of the compound (S-2) used in Example 1 | 0.41 g |
| The silver halide emulsion used in Example 1 | 0.50 g |
| 5 Wt. % aqueous solution of the surface active agent used in Example 1 | 0.40 g |
| The reducing agent dispersion used in Example 1 | 1.20 g |
| Water | 7.80 g |
| 10 Wt. % aqueous solution of a polymer comprising the repeating unit (I-2) used in Example 1 | 5.25 g |

TABLE 3

| Light-sensitive material | Polymer | Amount of Polymer*** | Peeling (adhesive) force | Image formation* |
|---|---|---|---|---|
| Example 11 | I-2 | 10.0 wt. % | 105 g/2 cm | A |

(Remark)
Image formation*: A: No problems were observed in the image.
Amount of polymer**: Weight ratio of the polymer to polyvinyl alcohol contained in the light-sensitive layer

We claim:
1. A silver halide light-sensitive material comprising a support, a hardening layer and a light-sensitive layer, said hardening layer containing an ethylenically unsaturated polymerizable compound or an ethylenically unsaturated cross-linkable polymer, said light-sensitive layer containing silver halide and a hydrophilic polymer, and said hardening layer or said light-sensitive layer containing a reducing agent, wherein an adhesive layer containing a water-soluble synthetic polymer is provided between the hardening layer and the light-sensitive layer, said water-soluble synthetic polymer comprising a repeating unit represented by the formula (I) in an amount of at least 50 mol %:

in which each of n1 and n2 independently is an integer of 10 to 5,000; each of $R^1$ and $R^2$ independently is hydrogen, an alkyl group having 1 to 10 carbon atoms or an aryl group having 6 to 10 carbon atoms, and the groups represented by $R^1$ or $R^2$ may be different from each other; X is —O—$R^4$—O— or —$NR^5$—; $R^4$ is an alkylene group having 2 to 20 carbon atoms, an alkyleneoxyalkylene group having 4 to 20 carbon atoms, an arylene group having 6 to 20 carbon atoms or an aralkylene group having 7 to 20 carbon atoms; $R^5$ is an alkyl group having 1 to 20 carbon atoms or an aryl group having 6 to 20 carbon atoms; $Y^1$ is —CO— or —CONH—; $Y^2$ is —CO— or —NHCO—; and $R^3$ is an alkylene group having 1 to 20 carbon atoms, an alkenylene group having 2 to 20 carbon atoms, an arylene group having 6 to 20 carbon atoms or an aralkylene group having 7 to 20 carbon atoms.

2. The silver halide light-sensitive material as claimed in claim 1, wherein the repeating unit is represented by the formula (Ia):

in which each of m1 and m2 independently is an integer of 20 to 3,000; each of $R^{11}$ and $R^{12}$ independently is hydrogen, methyl, ethyl or phenyl, and the groups represented by $R^{11}$ or $R^{12}$ may be different from each other; $X^{10}$ is —O—$R^{14}$—O— or —$NR^{15}$—; $R^{14}$ is ethylene or propylene; $R^{15}$ is an alkyl group having 1 to 10 carbon atoms or an aryl group having 6 to 10 carbon atoms; $Y^{11}$ is —CO— or —CONH—; $Y^{12}$ is —CO— or —NHCO—; and $R^{13}$ is an alkylene group having 1 to 20 carbon atoms, an arylene group having 6 to 20 carbon atoms or an aralkylene group having 7 to 20 carbon atoms.

3. The silver halide light-sensitive material as claimed in claim 1, wherein the adhesive layer further contains a water-soluble polysaccharide.

4. The silver halide light-sensitive material as claimed in claim 1, wherein the hardening layer contains the ethylenically unsaturated polymerizable compound and the ethylenically unsaturated cross-linkable polymer.

5. The silver halide light-sensitive material as claimed in claim 1, wherein the silver halide light-sensitive material comprises the support, the hardening layer, the adhesive layer and the light-sensitive layer in the order.

6. The silver halide light-sensitive material as claimed in claim 1, wherein the silver halide light-sensitive material further comprises an image formation accelerating layer containing a base or base precursor.

7. The silver halide light-sensitive material as claimed in claim 6, wherein the silver halide light-sensitive material comprises the support, the hardening layer, the adhesive layer, the light-sensitive layer and the image formation accelerating layer in the order.

8. A silver halide light-sensitive material comprising a support, a hardening layer and a light-sensitive layer, said hardening layer containing an ethylenically unsaturated polymerizable compound or an ethylenically unsaturated cross-linkable polymer, said light-sensitive layer containing silver halide and a hydrophilic polymer, and said hardening layer or said light-sensitive layer containing a reducing agent, wherein the light-sensitive layer further contains a water-soluble synthetic polymer comprising a repeating unit represented by the formula (I) in an amount of at least 50 mol %:

in which each of n1 and n2 independently is an integer of 10 to 5,000; each of $R^1$ and $R^2$ independently is hydrogen, an alkyl group having 1 to 10 carbon atoms or an aryl group having 6 to 10 carbon atoms, and the groups represented by $R^1$ or $R^2$ may be different from each other; X is —O—$R^4$—O— or —$NR^5$—; $R^4$ is an alkylene group having 2 to 20 carbon atoms, an alkyleneoxyalkylene group having 4 to 20 carbon atoms, an arylene group having 6 to 20 carbon atoms or an aralkylene group having 7 to 20 carbon atoms; $R^5$ is an alkyl group having 1 to 20 carbon atoms or an aryl group having 6 to 20 carbon atoms; $Y^1$ is —CO— or —CONH—; $Y^2$ is —CO— or —NHCO—; and $R^3$ is an alkylene group having 1 to 20 carbon atoms, an alkenylene group having 2 to 20 carbon atoms, an arylene group having 6 to 20 carbon atoms or an aralkylene group having 7 to 20 carbon atoms.

9. The silver halide light-sensitive material as claimed in claim 8, wherein the repeating unit is represented by the formula (Ia):

in which each of m1 and m2 independently is an integer of 20 to 3,000; each of $R^{11}$ and $R^{12}$ independently is hydrogen, methyl, ethyl or phenyl, and the groups represented by $R^{11}$ or $R^{12}$ may be different from each other; $X^{10}$ is —O—$R^{14}$—O— or —$NR^{15}$—; $R^{14}$ is ethylene or propylene; $R^{15}$ is an alkyl group having 1 to 10 carbon atoms or an aryl group having 6 to 10 carbon atoms; $Y^{11}$ is —CO— or —CONH—; $Y^{12}$ is —CO— or —NHCO—; and $R^{13}$ is an alkylene group having 1 to 20 carbon atoms, an arylene group having 6 to 20 carbon atoms or an aralkylene group having 7 to 20 carbon atoms.

10. The silver halide light-sensitive material as claimed in claim 8, wherein the light-sensitive layer further contains a water-soluble polysaccharide.

11. The silver halide light-sensitive material as claimed in claim 8, wherein the hardening layer contains the ethylenically unsaturated polymerizable compound and the ethylenically unsaturated cross-linkable polymer.

12. The silver halide light-sensitive material as claimed in claim 8, wherein the silver halide light-sensitive material comprises the support, the hardening layer and the light-sensitive layer in the order.

13. The silver halide light-sensitive material as claimed in claim 8, wherein the silver halide light-sensitive material further comprises an image formation accelerating layer containing a base or base precursor.

14. The silver halide light-sensitive material as claimed in claim 13, wherein the silver halide light-sensitive material comprises the support, the hardening layer, the light-sensitive layer and the image formation accelerating layer in the order.

* * * * *